United States Patent [19]
Matsuo et al.

[11] Patent Number: 5,089,869
[45] Date of Patent: Feb. 18, 1992

[54] SEMICONDUCTOR MEMORY DEVICE

[75] Inventors: Naoto Matsuo, Osaka; Shozo Okada, Kobe; Michihiro Inoue, Ikoma, all of Japan

[73] Assignee: Matsushita Electric Industrial Co. Ltd., Osaka, Japan

[21] Appl. No.: 564,087

[22] Filed: Aug. 7, 1990

[30] Foreign Application Priority Data

Aug. 8, 1989 [JP] Japan .................. 1-203832
Aug. 9, 1989 [JP] Japan .................. 1-204858

[51] Int. Cl.$^5$ .......................................... H01L 27/78
[52] U.S. Cl. ....................... 357/23.6; 357/51; 357/55
[58] Field of Search ............ 357/23.6, 23.6 G, 51, 357/55

[56] References Cited

U.S. PATENT DOCUMENTS 4,958,318 9/1990 Harari ..................... 357/23.6

OTHER PUBLICATIONS

S. Inoue et al., "A Spread Stacked Capacitor (SSC) Cell for 64 mbit DRAMs", International Electron Device Meeting Technical Digest Papers, pp. 31–34 (1989).
H. Watanabe et al., "Stacked Capacitor Cells for High--density Dynamic RAMs", IDEM Digest of Technical Papers (1988), pp. 600–613.
S. Nakajimi et al., "An Isolation-Merged Vertical Capacitor Cell for Large Capacity DRAM," IEDM Digest of Technical Papers (1988), pp. 240–243.

Primary Examiner—Edward J. Wojciechowicz
Attorney, Agent, or Firm—Ratner & Prestia

[57] ABSTRACT

Disclosed is a semiconductor memory device comprising a semiconductor substrate on which memory cells are formed, each including a switching transistor formed on the semiconductor substrate and a capacitor disposed above the switching transistor. The capacitor has a storage electrode, a cell plate and a capacitor insulating film sandwiched therebetween. The storage electrodes of at least two adjacent memory cells are partly disposed one above the other, with part of the cell plate interposed therebetween. Also disclosed is a semiconductor memory device in which the capacitors of the memory cells are disposed in a trench formed in the semiconductor substrate. The two switching transistors of two adjacent memory cells are located on each island-shaped active region surrounded by the trench. The storage electrodes of the capacitors of the two adjacent memory cells extend side by side around the corresponding active region, with part of the cell plate interposed between the storage electrodes.

4 Claims, 11 Drawing Sheets

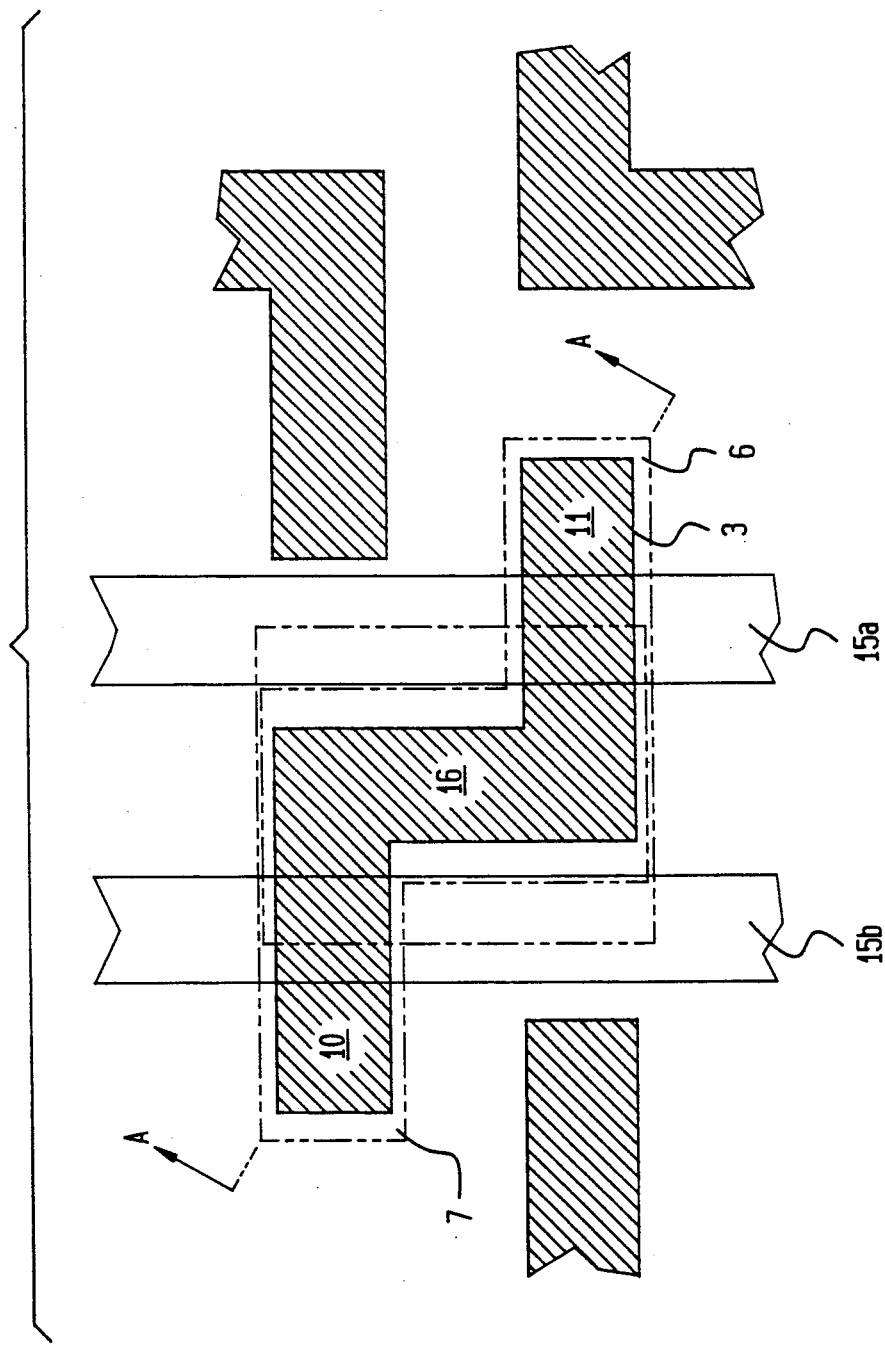

SEMICONDUCTOR MEMORY DEVICE

BACKGROUND OF THE INVENTION

1. Field of the Invention

The present invention relates to a semiconductor memory device, and more particularly to a semiconductor memory device having memory cells each including a three-dimensional capacitor suitable for the purpose of attaining a higher integration level.

2. Description of the Prior Art

FIG. 6 is a sectional view showing a memory cell portion of a conventional semiconductor memory device, which is a stack-type DRAM.

The stack-type DRAM comprises a semiconductor substrate 61 on which switching transistors 65 are formed, each switching transistor 65 being connected to a stacked capacitor 100 and a bit line 70.

Each of the switching transistors 65 is a MOS transistor, and is formed on each element region (active region) of the semiconductor substrate 61. The respective element regions are surrounded by an isolating oxide film 62a so that they are electrically isolated from one another.

The switching transistor 65 comprises a source region 63 and a drain region 64 both formed in the semiconductor substrate 61, and also comprises a gate electrode 66 disposed between the source region 63 and the drain region 64 and slightly above the semiconductor substrate 61. Between the gate electrode 66 and the semiconductor substrate 61 is disposed a gate insulating film 62b. The top and sides of the gate electrode 66 are covered with an insulating film 62c.

The stacked capacitor 100 comprises a storage electrode 67, a cell plate 69, and a capacitor insulating film 68 interposed therebetween.

The source region 63 of the switching transistor 65 is in contact with the storage electrode 67, while the drain region 64 of the switching transistor 65 is in contact with the bit line 70.

An insulating film 62d covers all the above-mentioned elements, lines, etc., formed on the semiconductor substrate 61.

In this DRAM, electric carriers are accumulated and stored in the storage electrode 67 of the capacitor 100.

When the switching transistor 65 is turned on, the electric carriers stored in the capacitor 100 are delivered from the storage electrode 67 into the source region 63, and then transmitted through the portion of the semiconductor substrate 61 below the gate electrode 66, and through the drain region 64, and then into the bit line 70.

As the switching transistor 65 is turned on or off, writing of data to the capacitor 100 or reading of data therefrom is executed.

FIG. 7 is a sectional view showing a memory cell portion of another conventional semiconductor memory device, which is a stacked trench-type DRAM.

The stacked trench-type DRAM comprises an IVEC (Isolation-Merged Vertical Capacitor) memory cell structure.

This stacked trench-type DRAM (IVEC-DRAM) comprises a semiconductor substrate 71 on which switching transistors 75 are formed, each switching transistor 75 being connected to a capacitor 200 and a bit line 80.

Each of the switching transistors 75 is a MOS transistor and is formed on each element region 81 of the semiconductor substrate 71. The respective element regions 81 are surrounded by a trench 82 so that they are electrically isolated from one another.

The switching transistor 75 comprises a source region 73 and a drain region 74 both formed in the semiconductor substrate 71, and also comprises a gate electrode 75 disposed between the source region 73 and the drain region 74 and slightly above the semiconductor substrate 71. Between the gate electrode 76 and the semiconductor substrate 71 is interposed a gate insulating film 72b. The top and sides of the gate electrode 76 are covered with a gate insulating film 72c.

The stacked trench-type DRAM of FIG. 7 is different from the stack-type DRAM of FIG. 6 in the structure of the capacitor 200, as will be described below.

The capacitor 200 shown in FIG. 7 is disposed within the trench 82 formed in the semiconductor substrate 71. The capacitor 200 comprises a storage electrode 77, a cell plate 79, and a capacitor insulating film 78 interposed therebetween, all of which are electrically isolated from the semiconductor substrate 71 by means of an insulating film 72a formed on the bottom and sides of the trench 82.

The source region 73 of the switching transistor 75 is in contact with the storage electrode 77 disposed in the trench 82, while the drain region 74 of the switching transistor 75 is in contact with the bit line 80.

In this DRAM, electric carriers are accumulated and stored in the capacitor 200.

When the switching transistor 75 is turned on, the electric carriers stored in the capacitor 200 are delivered from the storage electrode 77 into the source region 73, and then transmitted through the portion of the semiconductor substrate 71 below the gate electrode 76, and through the drain region 74, and then into the bit line 80.

As the switching transistor 75 is turned on or off, writing of data to the capacitor 200 or reading of data therefrom is executed.

The stack-type DRAM is described in more detail by H. Watanabe et al., in "Stacked Capacitor Cells for High-density dynamic RAMs; IEDM Dig. of Tech. papers (1988), p. 600". The trench-type DRAM is described in more detail by Shigeru Nakajima et al., in "An Isolation-Merged Vertical Capacitor Cell for Large Capacity DRAM; IEDM Dig. of Tech. Papers (1988), p. 240".

Conventional DRAMs of the above-mentioned types have the following problems:

In the stack-type DRAM shown in FIG. 6, as the memory cells become smaller in size and spaces therebetween become narrower for attaining a higher integration level, the area of the storage electrode 67 of the capacitor 100 is reduced, thereby decreasing the capacitance thereof.

The IVEC-DRAM shown in FIG. 7 also involves the above-mentioned problem. In the IVEC-DRAM, if the depth of the trench 82 is increased, the area of the storage electrode 77 of the capacitor 200 can be enlarged to attain larger capacitance. However, since it is difficult to produce a semiconductor memory device having a deeper trench, the increase in the depth of the trench will cause a great reduction in the yield of the memory devices.

SUMMARY OF THE INVENTION

The semiconductor memory device of this invention, which overcomes the above-discussed and numerous other disadvantages and deficiencies of the prior art, comprises: a semiconductor substrate having a plurality of active regions electrically isolated from one another; and a plurality of memory cells formed on said semiconductor substrate, each of which has a switching transistor formed on the corresponding active region, and a capacitor disposed above said switching transistor, said capacitor having a storage electrode, a cell plate, and a capacitor insulating film interposed therebetween, said storage electrode being connected to said switching transistor, and said cell plate being common to all the memory cells on said semiconductor substrate; wherein the storage electrodes of at least two adjacent memory cells are partly disposed one above the other with part of said cell plate interposed therebetween.

In a preferred embodiment, the switching transistors which are respectively connected to the two storage electrodes partly disposed one above the other are both placed in one of said active regions.

In another preferred embodiment, the switching transistors which are respectively connected to the two storage electrodes partly disposed one above the other are placed in two different active regions.

Another semiconductor memory device of the present invention comprises: a semiconductor substrate having a trench formed therein and a plurality of island-shaped active regions electrically isolated from one another by said trench; and a plurality of memory cells formed on said semiconductor substrate, each of which has a switching transistor formed on the corresponding island-shaped active region, and a capacitor disposed within said trench, said capacitor having a storage electrode, a cell plate, and a capacitor insulating film interposed therebetween, said storage electrode being connected to said switching transistor, and said cell plate being common to all the capacitors in said trench; wherein the switching transistors of two adjacent memory cells are formed on each island-shaped active region, and the two storage electrodes respectively connected to said switching transistors of said two adjacent memory cells extend side by side around the sides of said island-shaped active region, with part of said cell plate interposed between said two storage electrodes and with an insulating film interposed between said island-shaped active region and the inner one of said two storage electrodes.

Thus, the invention described herein makes possible the objectives of (1) providing a semiconductor memory device with a high integration level which comprises stacked capacitors having large capacitance; and (2) providing a semiconductor memory device with a high integration level which comprises a shallow trench containing capacitors having large capacitance and can be produced without difficulty.

BRIEF DESCRIPTION OF THE DRAWINGS

This invention may be better understood and its numerous objects and advantages will become apparent to those skilled in the art by reference to the accompanying drawings as follows:

FIG. 1B is a plan view showing the layout of the semiconductor memory device of FIG. 1A.

DESCRIPTION OF THE PREFERRED EMBODIMENTS

EXAMPLE 1

Figure 1A:
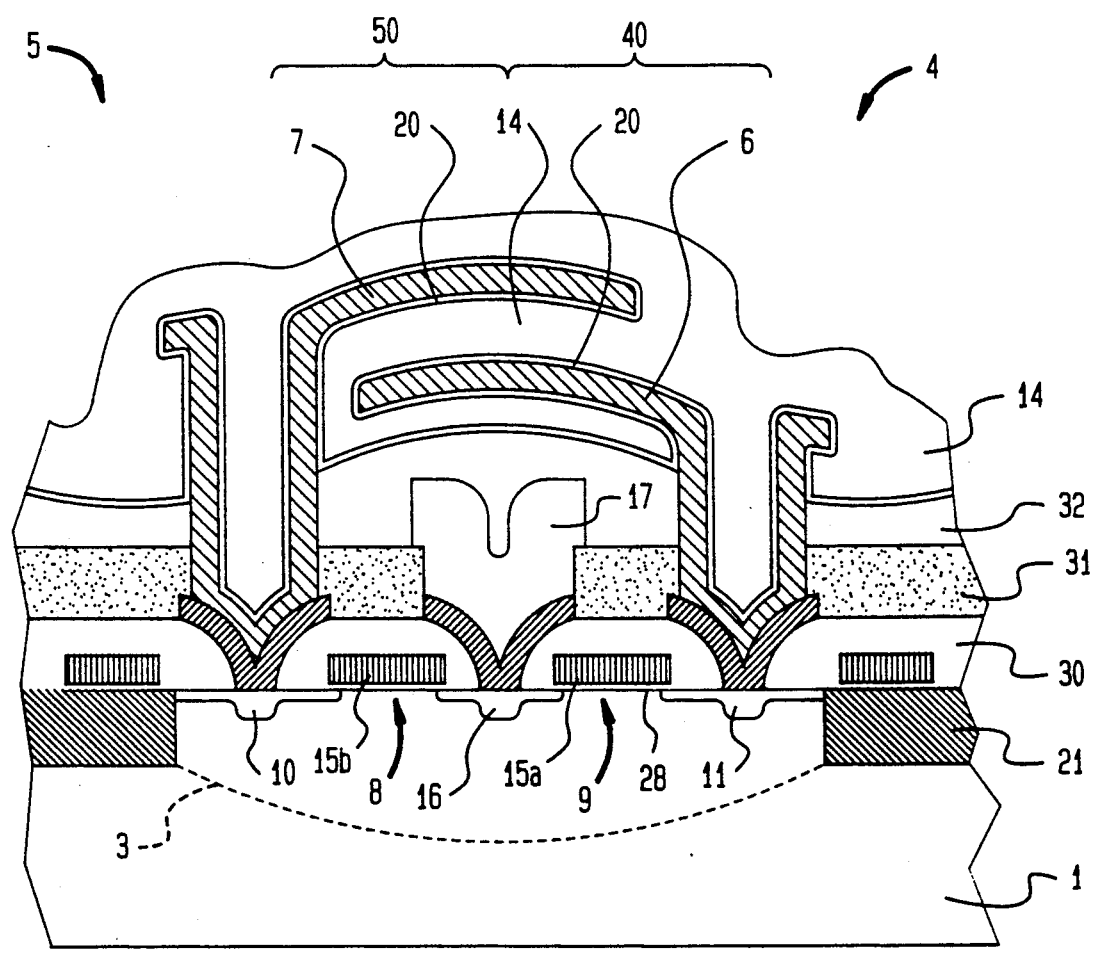
FIG. 1A is a sectional view of a semiconductor memory device of this invention.

FIG. 1A is a sectional view showing the main portion of a semiconductor memory device of the present invention.

The semiconductor memory device of this example is a stack-type DRAM, which comprises a semiconductor substrate 1 provided with a plurality of element regions (active regions) 3. In this example, on each element region 3 are formed first and second switching transistors 9 and 8, which are MOS transistors. The first and second switching transistors 9 and 8 are connected to first and second stacked capacitors 40 and 50, respectively, and also connected to a common bit line 17.

In this example, the first switching transistor 9 and the first capacitor 40, etc., constitute a first memory cell 4, while the second switching transistor 8 and the second capacitor 50, etc., constitute a second memory cell 5.

The respective element regions 3 are surrounded by a buried oxide film 21 which is formed in the surface portion of an isolation region of the semiconductor substrate 1, so that the element regions are electrically isolated from one another.

The layout of the first and second memory cells 4 and 5 on the semiconductor substrate 1 will be described later with reference to FIG. 1B.

The first and second switching transistors 9 and 8 have source regions 10 and 11, respectively, and have a drain region 16 in common. The source regions 10 and 11 and the drain region 16 are formed in the semiconductor substrate 1. The first switching transistor 9 also has a gate electrode 15a formed between the source region 11 and the drain region 16 and slightly above the semiconductor substrate 1, while the second switching transistor 8 has a gate electrode 15b formed between the drain region 16 and the source region 10 and slightly above the semiconductor substrate 1. Gate insulating films 28 are sandwiched between the gate electrode 15a and the semiconductor substrate 1 and between the gate electrode 15b and the semiconductor substrate 1.

The tops and sides of the gate electrodes 15a and 15b are covered with insulating films 30, on which an HTO film 31 is disposed to cover all the switching transistors 8 and 9 formed on the semiconductor substrate 1.

The bit line 17 through which electric carriers are transmitted is disposed on the HTO film 31. A BPSG film 32 is further disposed on the HTO film 31 to cover the bit line 17.

On the BPSG film 32, the first and second stacked capacitors 40 and 50 are disposed.

The first capacitor 40 includes a first storage electrode 6, a cell plate 14, and a capacitor insulating film 20 interposed therebetween. The cell plate 14 is common to all the first and second capacitors 40 and 50 on the semiconductor substrate 1.

The second capacitor 50 includes a second storage electrode 7, the cell plate 14 which also belongs to the first capacitor 40, and a capacitor insulating film 20 interposed between the second storage electrode 7 and the cell plate 14.

In this example, as shown in FIG. 1A, part of the first storage electrode 6 and part of the second storage electrode 7 are disposed one above the other with part of the cell plate 14 interposed therebetween. Thus, the electrode of one memory cell extends into another memory cell adjacent thereto, so that the area of the electrode can be greatly enlarged. As a result, even when the size of memory cells and the spaces therebetween are reduced for the improvement of the integration thereof, the area of the electrode of each capacitor can be kept sufficiently large so as to attain large capacitance.

The source regions 11 and 10 of the first and second switching transistors 9 and 8 are in contact with the first and second storage electrodes 6 and 7, respectively. The drain region 16 of the first and second switching transistors 9 and 8 is in contact with the bit line 17 through which electric carriers are transmitted.

When the first switching transistor 9 is turned on, the electric carriers stored in the first capacitor 40 are delivered from the first storage electrode 6 into the source region 11, and then transmitted through the portion of the semiconductor substrate 1 below the gate electrode 15a, and through the drain region 16, and then into the bit line 17.

Similarly, when the second switching transistor 8 is turned on, the electric carriers stored in the second capacitor 50 are delivered from the second storage electrode 7 into the source region 10, and then transmitted through the portion of the semiconductor substrate 1 below the gate electrode 15b, and through the drain region 16, and then into the bit line 17.

As the first and second switching transistors 9 and 8 are turned on or off, the writing of data into the respective capacitors 40 and 50 or the reading of data therefrom is executed.

The capacitor insulating film 20 is an oxinitride film. A high dielectric material such as $Ta_2O_5$ is also preferable as the material for the capacitor insulating film 20.

The gate electrodes 15a and 15b comprise a polycide structure and function as word lines. The bit line 17 is made of a poly crystal silicon layer and has a thickness of 0.25 μm. The storage electrodes 6 and 7 and the cell plate 14 are all made of poly crystal silicon layers and have a thickness of 0.1 μm.

FIG. 1B is a plan view showing the layout of the semiconductor memory device of this example. The sectional view of FIG. 1A is taken along the line A—A shown in FIG. 1B.

In FIG. 1B, the element regions 3 are shown as the areas indicated by the solid lines with oblique lines therein. The first storage electrode 6 is indicated by the dash-dot line, while the second storage electrode 7 is indicated by the two-dot dash line.

In this example, a plurality of first memory cells 4 and a plurality of second memory cells 5 are alternately arranged (in a matrix) on the semiconductor substrate 1. In each set of first and second memory cells 4 and 5 adjacent to each other, part of the first storage electrode 6 and part of the second storage electrode 7 are disposed one above the other.

In the semiconductor memory device of this example, the contact area between the storage electrode 7(6) and the source region 10(11) is $0.40 \times 0.40$ μm$^2$, the width of the word lines (the gate electrodes 15a and 15b) is 0.4 μm, the width of the bit line 17 is 0.4 μm, the width of the narrowest portion of the isolation region is 0.4 μm, and the area of each memory cell is 1.8 μm$^2$.

When the thickness of the capacitor insulating film 20 was set at 5 nm, the capacitance of each capacitor 40(50) was 38 fF.

Table 1 shown below indicates the measured values of the capacitance of the bit line 17, which is provided with 256 memory cells (thus corresponding to 256 bits). The total capacitance of the bit line 17 was 99.0 fF. Since the bit line 17 was covered with the storage electrodes 6 and 7, the ratio of the capacitance between the bit line 17 and the storage electrodes (6 and 7) to the total capacitance was 52%. The capacitance between the bit line 17 and the word lines (gate electrodes 15a and 15b), the capacitance between the bit line 17 and the semiconductor substrate 1, and the capacitance between the bit line 17 and the buried oxide film 21 are all shown in Table 1.

TABLE 1

|  | Capacitance of bit line (fF) | Ratio (%) |
| --- | --- | --- |
| Storage electrode | 51.2 | 52 |
| Word line | 35.8 | 36 |
| Substrate | 10.8 | 11 |
| Buried oxide | 1.2 | 1 |
| Total | 99.0 | 100 |

Figure 2:
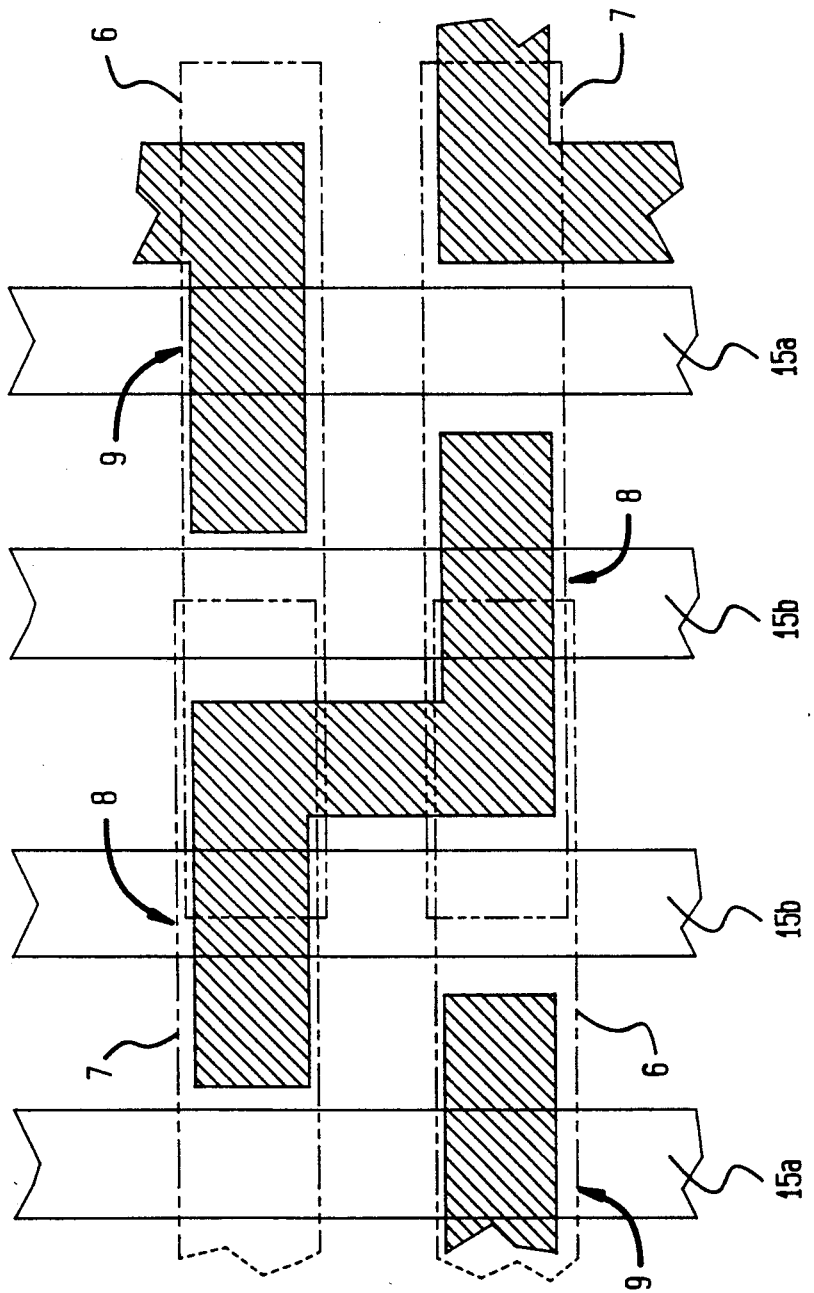
FIG. 2 is a plan view showing the layout of a modified version of the semiconductor memory device of FIG. 1A.

FIG. 2 is a plan view showing the layout of a modified version of the semiconductor memory device of FIG. 1A.

In FIG. 2, the element regions (active regions) are shown as the areas indicated by the solid lines with oblique lines therein. The first storage electrodes 6 are indicated by the dash-dot lines, while the second storage electrodes 7 are indicated by the two-dot dash lines.

In this layout, the first switching transistor 9 and the second switching transistor 8 are respectively formed in two adjacent element regions (hereinafter respectively referred to as first and second element regions for explanation convenience). Thus, the first storage electrode 6 connected to the first switching transistor 9 in the first element region extends over the isolation region into the area above the second element region where the second switching transistor 8 is formed. Similarly, the second storage electrode 7 connected to the second switching transistor 8 in the second element region extends over the isolation region into the area above the first element region where the first switching transistor 9 is formed.

The layout shown in FIG. 2 is advantageous in that very little proximity effect arises at the time of the patterning of the storage electrodes 6 and 7 with use of lithography or an etching technique. Thus, with this layout, the storage electrodes 6 and 7 with minute patterns can be produced with an excellent yield. Accordingly, this layout is suitable for a semiconductor memory device with a high integration level, such as a 256 Mb DRAM, an 1 Gb DRAM, etc.

EXAMPLE 2

Figure 3A:
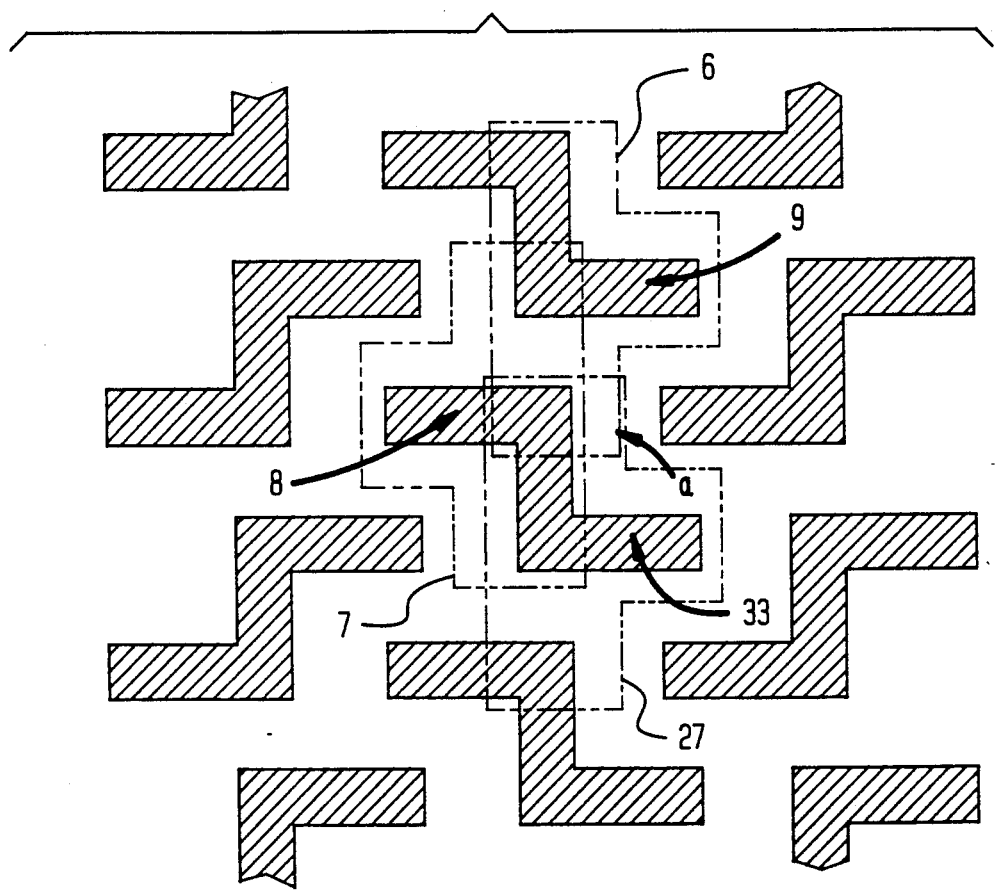
FIG. 3A is a plan view showing the layout of another semiconductor memory device of this invention.

FIG. 3A is a plan view showing the layout of another semiconductor memory device of the present invention. The semiconductor memory device of this example is a stack-type DRAM which is substantially the same as that of Example 1, except that a third memory cell is provided adjacent to the first and second memory cells in such a manner that the storage electrodes of the first, second, and third memory cells are partly disposed one above the other.

In FIG. 3A, the element regions (active regions) are shown as the areas indicated by the solid lines with oblique lines therein. The first storage electrode 6 of the first memory cell is indicated by the dash-dot line, the second storage electrode 7 of the second memory cell is indicated by the two-dot dash lines, and the third storage electrode 27 of the third memory cell is indicated by the broken line.

The part of the three storage electrodes 6, 7, and 27 disposed one above the other is indicated by the arrow a.

In this example, the second switching transistor 8 of the second memory cell and the third switching transistor 33 of the third memory cell are located in the same active region, while the switching transistor 9 of the first memory cell is located in an active region adjacent to the above-mentioned active region provided with the second and third switching transistors 8 and 33.

Figure 3B:
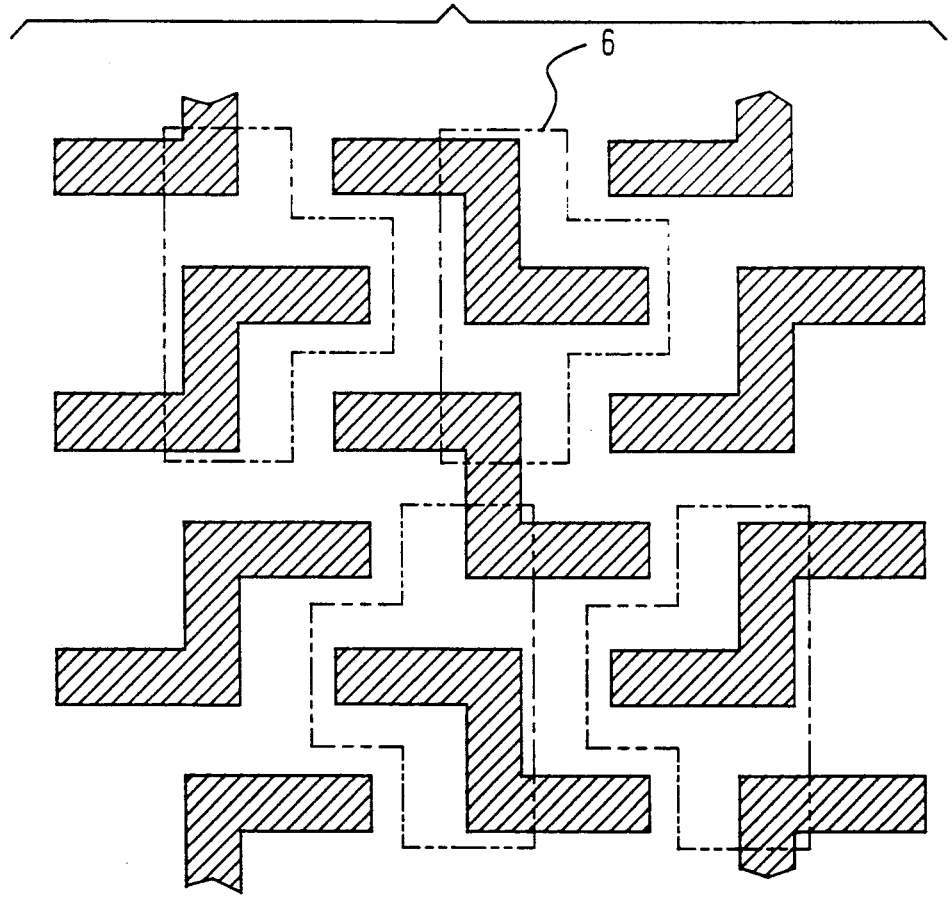
FIG. 3B is a plan view showing the positional relationship between active regions and first storage electrodes in the semiconductor memory device of FIG. 3A.
Figure 3C:
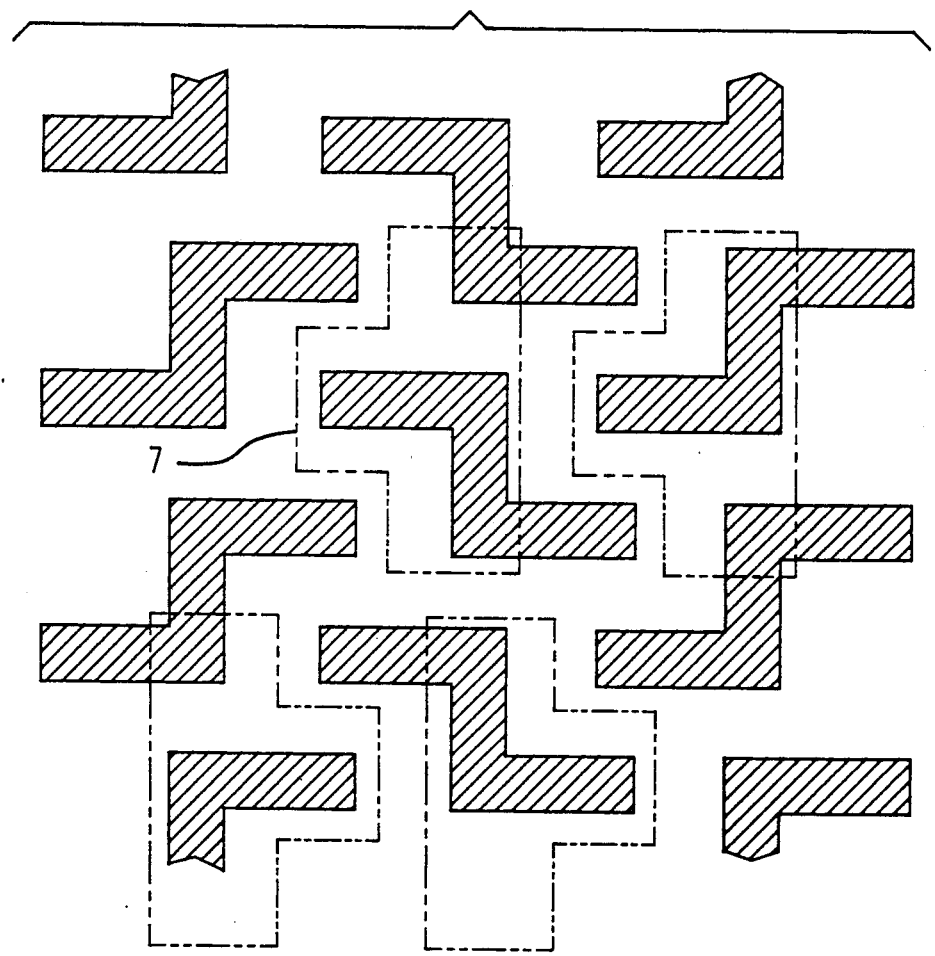
FIG. 3C is a plan view showing the positional relationship between active regions and second storage electrodes in the semiconductor memory device of FIG. 3A.
Figure 3D:
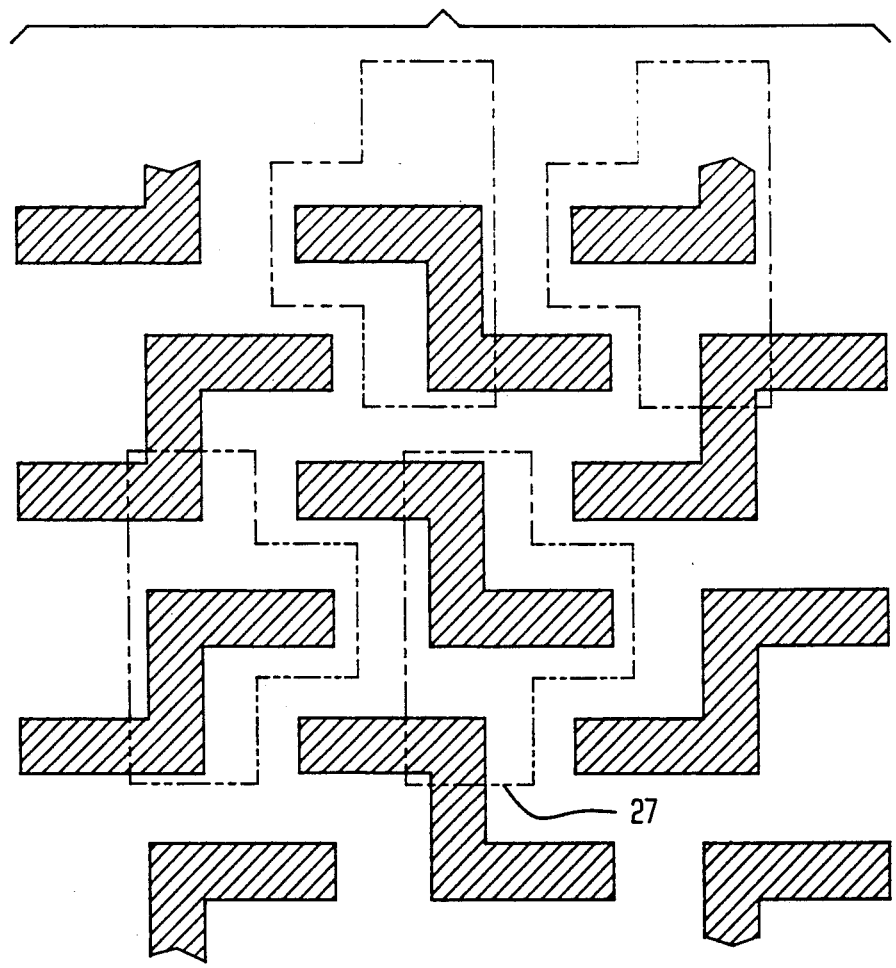
FIG. 3D is a plan view showing the positional relationship between active regions and third storage electrodes in the semiconductor memory device of FIG. 3A.

FIG. 3B shows the positional relationship between the active regions and the first storage electrodes 6. FIG. 3C shows the positional relationship between the active regions and the second storage electrodes 7. FIG. 3D shows the positional relationship between the active regions and the third storage electrodes 27.

As seen from the FIGS. 3B, 3C and 3D, the layouts of the storage electrodes 6, 7 and 27 on the semiconductor substrate are substantially the same, except that the patterns of the storage electrodes 6, 7 and 27 are shifted from each other by a predetermined length in the horizontal direction.

The storage electrodes 6, 7 and 27 are all made of a polysilicon film.

Thus, in this example, since three storage electrodes are disposed one above the other, the area of each storage electrode can be further enlarged, as compared with the semiconductor memory device of Example 1 in which two storage electrodes are disposed one above the other.

Figure 4:
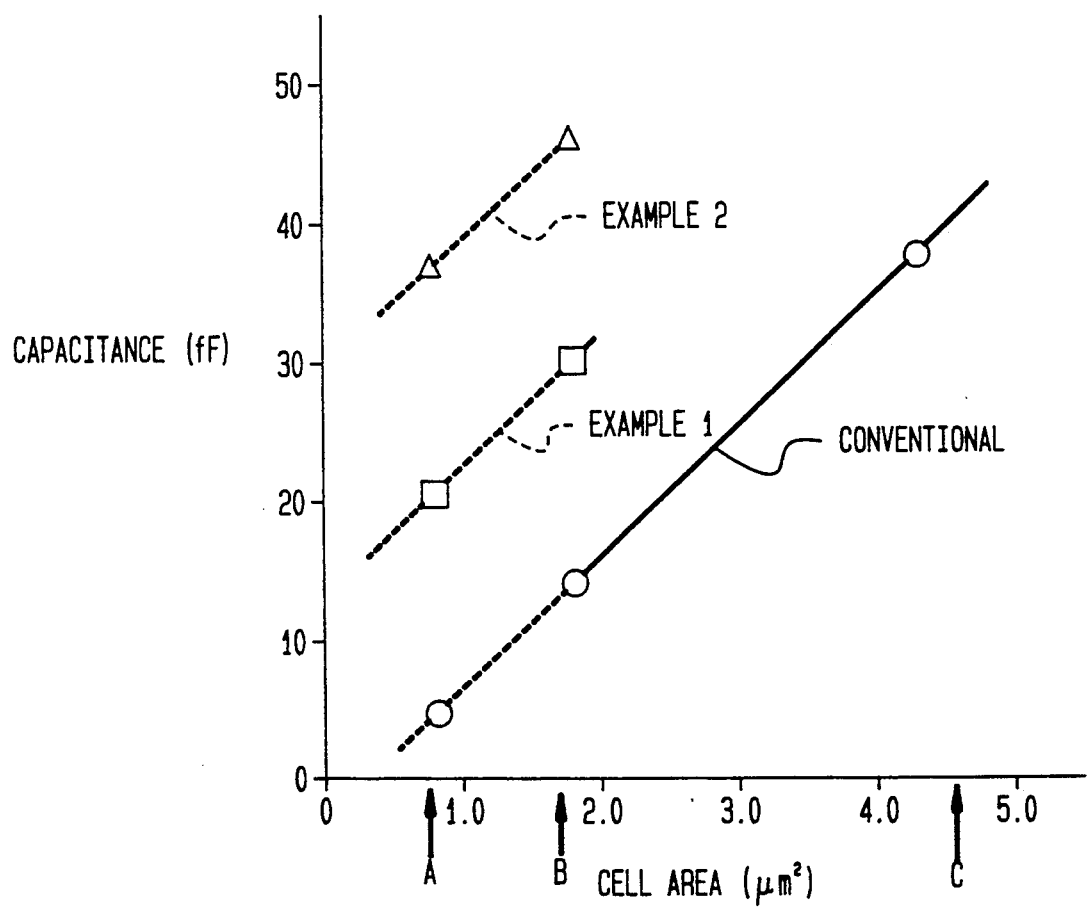
FIG. 4 is a graph showing the relationship between the cell capacitance and the cell area in the semiconductor memory devices of FIG. 1A and FIG. 3 and in a conventional semiconductor memory device.

FIG. 4 is a graph showing the relationship between the cell capacitance (the capacitance of each memory cell) and the cell area of each memory cell, in the semiconductor memory devices of Examples 1 and 2, and in a conventional semiconductor memory device.

The marks ◯, Δ and ☐ indicate the measured values of the cell capacitance with respect to the areas of memory cells of different sizes. The relationships shown by the curves of dotted lines and of the solid line were determined by calculation on the assumption that the capacitor insulating films have a thickness of 6 nm.

The arrows A, B and C correspond to the cell areas of memory cells in 256 Mb, 64 Mb, and 16 Mb DRAMs, respectively.

In Example 2, when the cell area was 0.7 $\mu m^2$ (which corresponds to the memory cell area of the 256 Mb DRAM as indicated by the arrow A), the capacitance was 36 fF, which was larger than those of Example 1 and the conventional memory device. This means that the structure of the semiconductor memory device of Example 2 is the most suitable for 256 Mb DRAMs.

The storage electrodes 6, 7 and 27 of Examples 1 and 2 are formed by the use of, for example, the technique described by T. Ema et al., in "IEDM Tech. Dig. (1988), pp. 592-595".

EXAMPLE 3

Figure 5A:
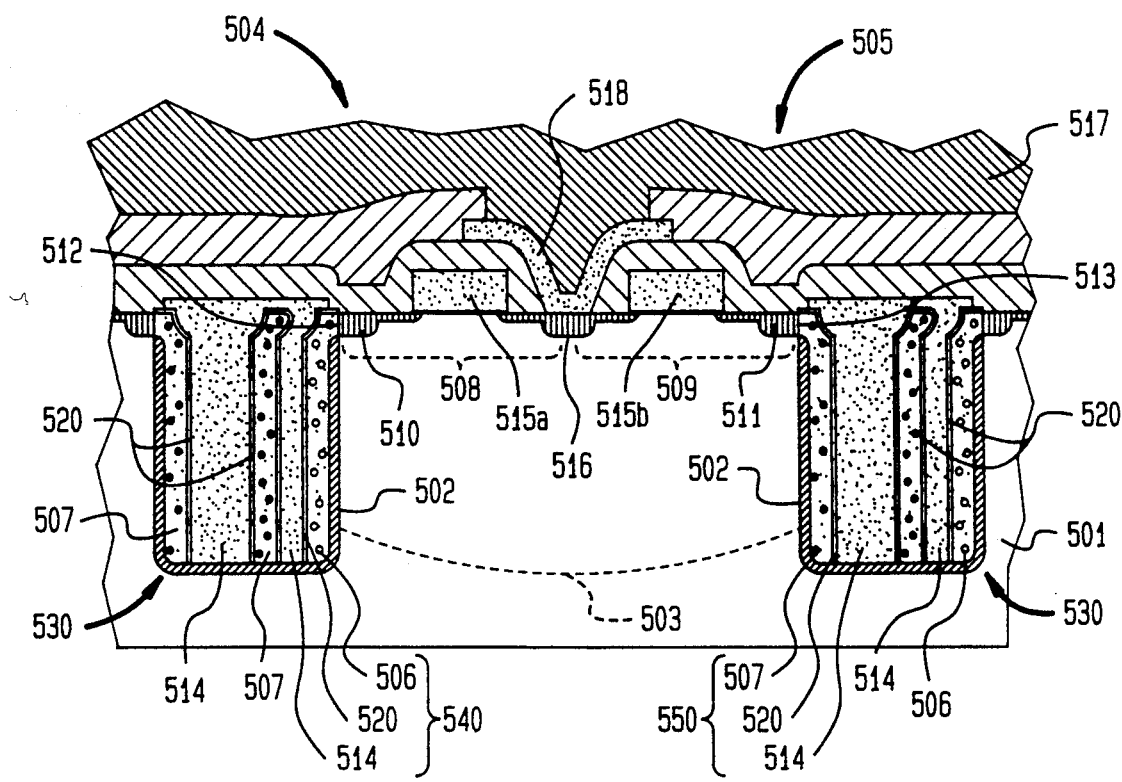
FIG. 5A is a sectional view showing still another semiconductor memory device of this invention.
Figure 5B:
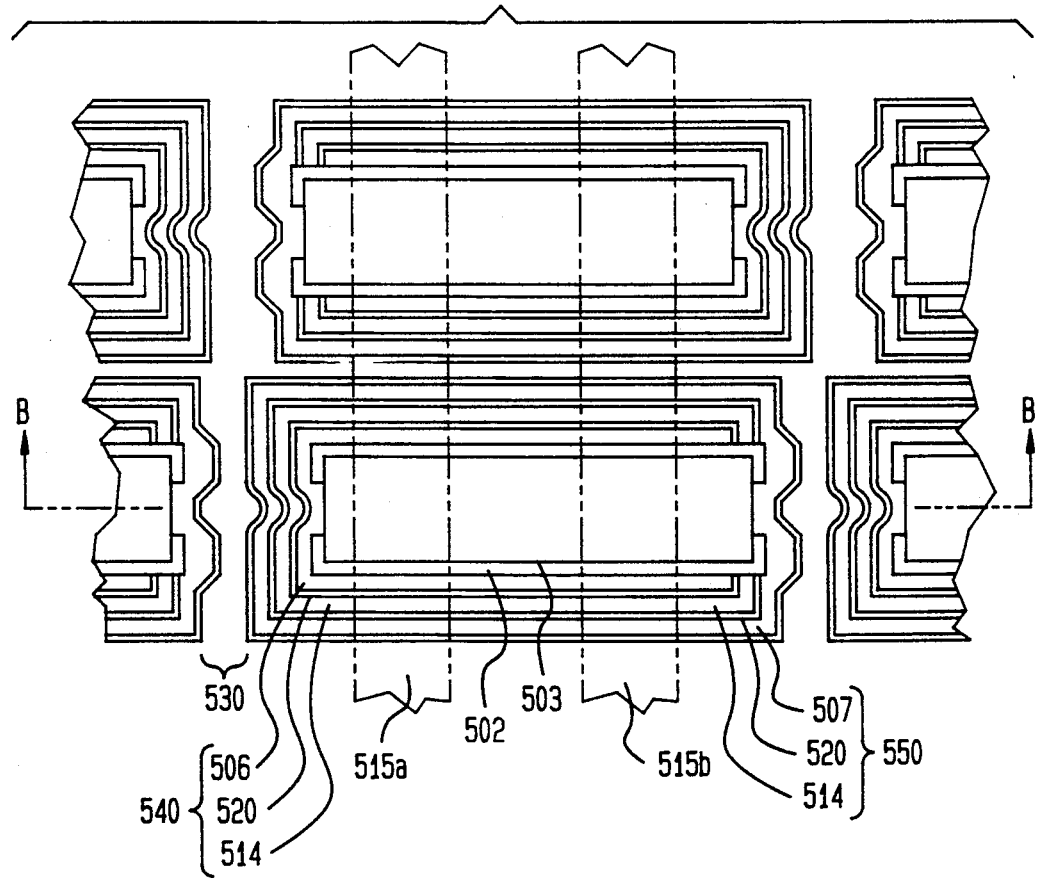
FIG. 5B is a plan view showing the layout of the semiconductor memory device of FIG. 5A.
Figure 6:
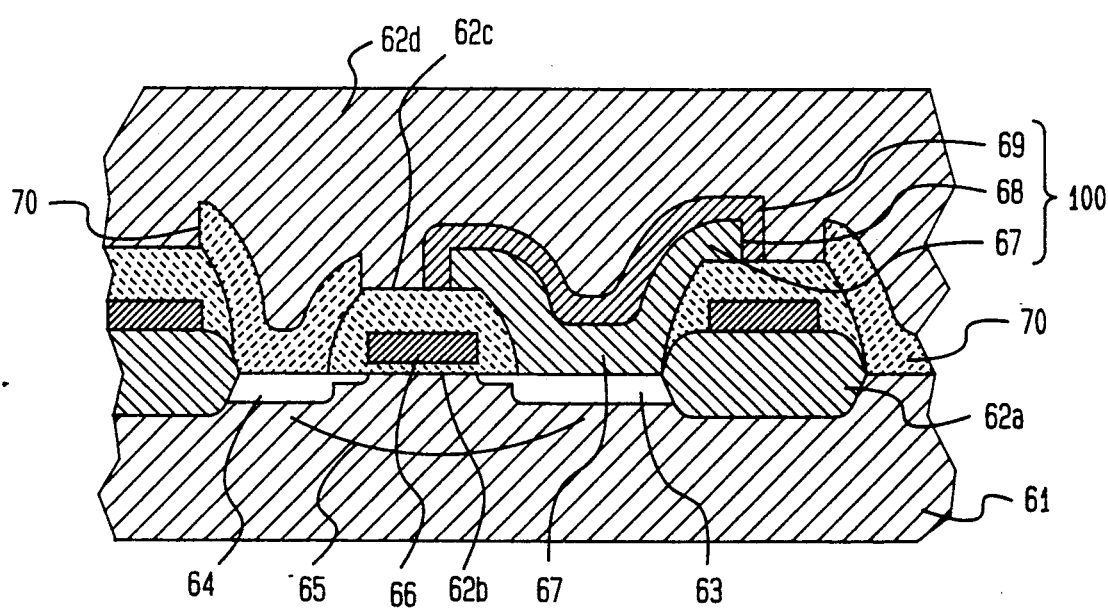
FIG. 6 is a sectional view showing a conventional semiconductor memory device.

FIG. 5A is a sectional view showing still another semiconductor memory device according to the invention. FIG. 5B is a plan view showing the semiconductor laser device of FIG. 5A. The sectional view of FIG. 5A is taken along the line B—B shown in FIG. 5B.

The semiconductor memory device of this example is a stacked trench-type DRAM, which comprises a semiconductor substrate 501 which is provided with a plurality of element regions (active regions) 503. The element regions are electrically isolated from one another by a trench 530 formed in an isolation region of the semiconductor substrate 501, and accordingly each element region 503 is in the form of an island surrounded by the trench 530. In each element region 503 (hereinafter referred to as an "Si island 503") of the semiconductor substrate 501 are formed first and second switching transistors 508 and 509 connected to first and second capacitors 540 and 550, respectively, and also connected to a common bit line 517.

In this example, the first switching transistor 508 and the first capacitor 540 connected thereto constitute a first memory cell 504, while the second switching transistor 509 and the second capacitor 550 connected thereto constitute a second memory cell 505.

The first and second switching transistors 508 and 509 have source regions 510 and 511, respectively, and have a drain region 516 in common. The source regions 510 and 511 and the drain region 516 are formed in the semiconductor substrate 501. The first switching transistor 508 has a gate electrode 515a located between the source region 510 and the drain region 516 and slightly above the semiconductor substrate 501, while the second switching transistor 509 has a gate electrode 515b located between the drain region 516 and the source region 511 and slightly above the semiconductor substrate 501. Gate insulating films are interposed between the gate electrode 515a and the semiconductor substrate 501 and between the gate electrode 515b and the semiconductor substrate 501.

The first and second memory cells 504 and 505 have first and second capacitors 540 and 550, respectively, which are disposed within the trench 530. The first and second capacitors 540 and 550 have a cell plate 514 in common. The cell plate 514 is common to all the capacitors formed in the trench 530. The first capacitor 540 has a first storage electrode 506 and a capacitor insulating film 520 interposed between the first storage electrode 506 and the cell plate 514, while the second capacitor 550 has a second storage electrode 507 and a capacitor insulating film 520 interposed between the second storage electrode 507 and the cell plate 514.

The capacitor insulating film 520 in this example is an oxinitride film (the thickness thereof being 5 nm in terms of the thickness of oxide films).

As shown in FIG. 5A, the semiconductor memory device of this example is different from those of Examples 1 and 2 in that the capacitors are formed within the trench 530 so that they surround the sides of each Si island 503.

Figure 7:
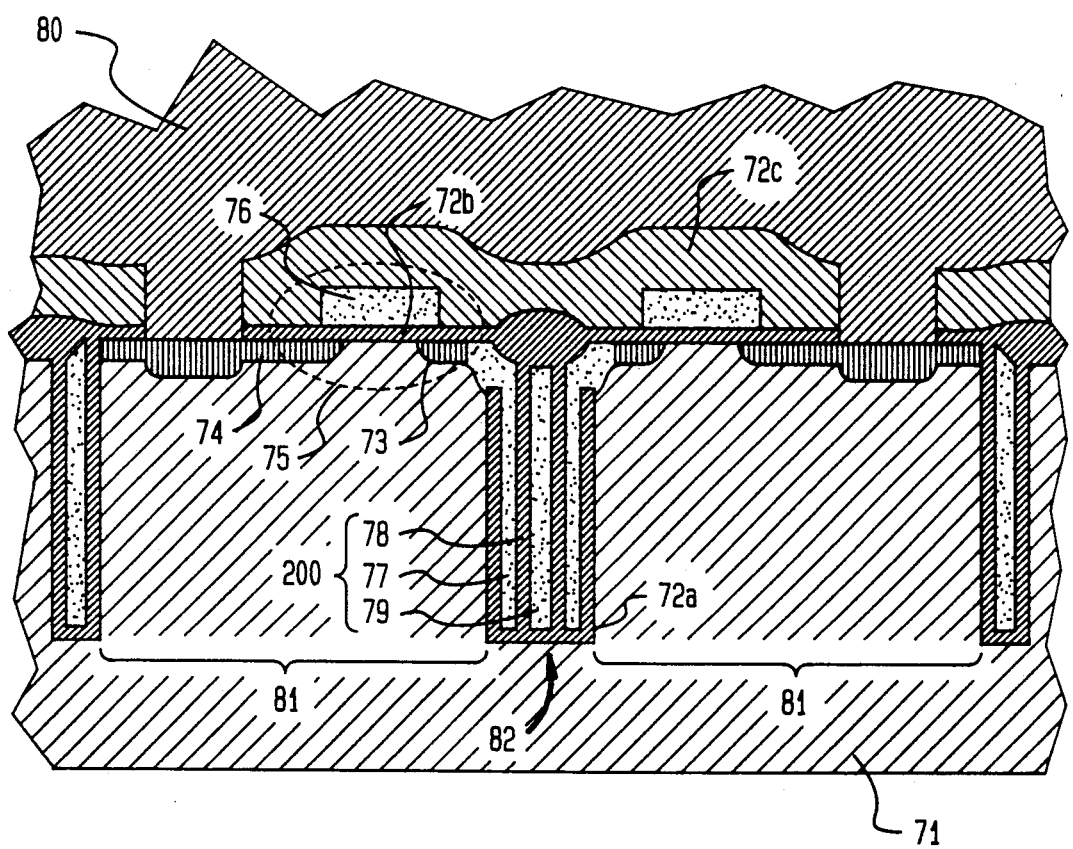
FIG. 7 is a sectional view showing another conventional semiconductor memory device.

The semiconductor memory device of this example is also different from the conventional semiconductor memory device shown in FIG. 7 in the following structure: As shown in FIG. 5B, the first storage electrode 506 of the first memory cell 504 surrounds the sides of the Si island 503, with an insulating film 502 being interposed therebetween. The insulating film 502 entirely covers the inner walls of the trench 530. The second storage electrode 507 of the second memory cell 505 is further disposed around the first storage electrode 506, with part of the cell plate 514 sandwiched therebetween. With this construction, the first and second storage electrodes 506 and 507 extend side by side around the Si island 503, so that the area of each electrode can be greatly enlarged without increasing the depth of the trench. Accordingly, even though the size of memory cells and the spaces therebetween are reduced for the purpose of attaining a higher integration level, the area of the electrodes of the capacitors 540 and 550 can be kept sufficiently large to obtain large capacitance.

The first and second switching transistors 508 and 509 are respectively connected to the first and second storage electrodes 506 and 507 in the following manner: The source region 510 of the first switching transistor 508 is connected to the first storage electrode 506 via a contact region 512 provided on the side of the Si island 503. Similarly, the source region 511 of the second switching transistor 509 is connected to the second storage electrode 507 via a contact region 513 provided on the side of the Si island 503.

The drain region 516 of the first and second switching transistors 508 and 509 is connected to the bit line 517 via a poly crystal silicon pad 518.

When the first switching transistor 508 is turned on, the electric carriers stored in the first capacitor 540 are delivered from the first storage electrode 506 into the source region 510, and then transmitted through the portion of the semiconductor substrate 501 below the gate electrode 515a, and through the drain region 516, and then into the bit line 517.

Similarly, when the second switching transistor 509 is turned on, the electric carriers stored in the second capacitor 550 are delivered from the second storage electrode 507 into the source region 511, and then transmitted through the portion of the semiconductor substrate 501 below the gate electrode 515b, and through the drain region 516, and then into the bit line 517.

As the switching transistors 508 and 509 are turned on or off, writing of data to the capacitors 540 and 550 or reading of data therefrom is executed.

The contact area between the bit line 517 and the drain electrode 516 is $0.5 \times 0.4$ $\mu m^2$, the width of the word lines (the gate electrodes 515a and 515b) is 0.4 $\mu m$, the width of the bit line 517 is 0.4 $\mu m$, the width of the narrowest portion of the isolation region is 0.9 $\mu m$, and the area of each memory cell is 1.6 $\mu m^2$.

When the thickness of the capacitor insulating film 520 was set at 5 nm and the depth of the trench 530 was set at 1.1 $\mu m$, the capacitance of each capacitor 540(550) was 45 fF.

In this example, the width of each storage electrode 506(507) and the thickness of the cell plate 514 are both 0.1 $\mu m$.

With the construction of this example, large capacitance can be obtained without increasing the depth of the trench. Thus, trench-type DRAMs with a high integration level can be readily produced.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. A semiconductor memory device comprising:
a semiconductor substrate having a plurality of active regions electrically isolated from one another; and
a plurality of memory cells formed on said semiconductor substrate, each of which has a switching transistor formed on the corresponding active region, and a capacitor disposed above said switching transistor, said capacitor having a storage electrode, a cell plate, and a capacitor insulating film interposed therebetween, said storage electrode being connected to said switching transistor, and said cell plate being common to all the memory cells on said semiconductor substrate;
wherein the storage electrodes of at least two adjacent memory cells are partly disposed one above the other with part of said cell plate interposed therebetween.

2. A semiconductor memory device according to claim 1, wherein the switching transistors which are respectively connected to the two storage electrodes partly disposed one above the other are both placed in one of said active regions.

3. A semiconductor memory device according to claim 1, wherein the switching transistors which are respectively connected to the two storage electrodes partly disposed one above the other are placed in two different active regions.

4. A semiconductor memory device comprising:
a semiconductor substrate having a trench formed therein and a plurality of island-shaped active regions electrically isolated from one another by said trench; and
a plurality of memory cells formed on said semiconductor substrate, each of which has a switching transistor formed on the corresponding island-shaped active region, and a capacitor disposed within said trench, said capacitor having a storage electrode, a cell plate, and a capacitor insulating film interposed therebetween, said storage electrode being connected to said switching transistor, and said cell plate being common to all the capacitors in said trench;

wherein the switching transistors of two adjacent memory cells are formed on each island-shaped active region, and the two storage electrodes respectively connected to said switching transistors of said two adjacent memory cells extend side by side around the sides of said island-shaped active region, with part of said cell plate interposed between said two storage electrodes and with an insulating film interposed between said island-shaped active region and the inner one of said two storage electrodes.

* * * * *